United States Patent
Ichihara et al.

(10) Patent No.: US 7,608,896 B2
(45) Date of Patent: Oct. 27, 2009

(54) SEMICONDUCTOR DEVICE

(75) Inventors: Reika Ichihara, Yokohama (JP);
Yoshinori Tsuchiya, Yokohama (JP);
Hiroki Tanaka, Yokohama (JP); Masato Koyama, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 11/857,197

(22) Filed: Sep. 18, 2007

(65) Prior Publication Data
US 2008/0135944 A1 Jun. 12, 2008

(30) Foreign Application Priority Data
Dec. 6, 2006 (JP) ............................. 2006-329521

(51) Int. Cl.
H01L 29/76 (2006.01)
H01L 29/94 (2006.01)
H01L 31/062 (2006.01)
H01L 31/113 (2006.01)
H01L 31/119 (2006.01)
H01L 23/62 (2006.01)

(52) U.S. Cl. ...................... 257/369; 257/338; 257/357; 257/371; 257/407; 257/E27.062; 257/E27.067; 257/E27.108

(58) Field of Classification Search ................. 257/338, 257/357, 369, 371, E27.062, E27.067, E27.108, 257/407
See application file for complete search history.

(56) References Cited

U.S. PATENT DOCUMENTS

| | | | | |
|---|---|---|---|---|
| 5,247,198 A | * | 9/1993 | Homma et al. | 257/371 |
| 5,654,209 A | * | 8/1997 | Kato | 438/528 |
| 6,410,376 B1 | * | 6/2002 | Ng et al. | 438/199 |
| 6,573,134 B2 | * | 6/2003 | Ma et al. | 438/216 |
| 6,881,631 B2 | * | 4/2005 | Saito et al. | 438/283 |
| 7,030,430 B2 | | 4/2006 | Doczy et al. | 257/249 |
| 7,045,406 B2 | * | 5/2006 | Huotari et al. | 438/198 |
| 7,129,182 B2 | * | 10/2006 | Brask et al. | 438/745 |

(Continued)

FOREIGN PATENT DOCUMENTS

JP 2004-207481 7/2004

OTHER PUBLICATIONS

U.S. Appl. No. 12/133,583, filed Jun. 5, 2008, Koyama, et al.

*Primary Examiner*—Ida M Soward
(74) *Attorney, Agent, or Firm*—Oblon, Spivak, McClelland, Maier & Neustadt, L.L.P.

(57) ABSTRACT

A semiconductor device has an n-channel MIS transistor and a p-channel MIS transistor on a substrate. The n-channel MIS transistor includes a p-type semiconductor region formed on the substrate, a lower layer gate electrode which is formed via a gate insulating film above the p-type semiconductor region and which is one monolayer or more and 3 nm or less in thickness, and an upper layer gate electrode which is formed on the lower layer gate electrode, whose average electronegativity is 0.1 or more smaller than the average electronegativity of the lower layer gate electrode. The p-channel MIS transistor includes an n-type semiconductor region formed on the substrate and a gate electrode which is formed via a gate insulating film above the n-type semiconductor region and is made of the same metal material as that of the upper layer gate electrode.

18 Claims, 11 Drawing Sheets

U.S. PATENT DOCUMENTS

| | | | |
|---|---|---|---|
| 7,141,858 B2 * | 11/2006 | Polishchuk et al. | 257/407 |
| 7,316,950 B2 * | 1/2008 | Park et al. | 438/199 |
| 7,361,538 B2 * | 4/2008 | Luan et al. | 438/197 |
| 7,425,478 B2 * | 9/2008 | Sasaki | 438/157 |
| 7,445,976 B2 * | 11/2008 | Schaeffer et al. | 438/197 |
| 2004/0004298 A1 * | 1/2004 | Madurawe | 257/903 |
| 2006/0084247 A1 * | 4/2006 | Liu | 438/510 |
| 2006/0244079 A1 * | 11/2006 | Wang et al. | 257/407 |
| 2007/0128858 A1 * | 6/2007 | Haukka et al. | 438/656 |
| 2007/0138563 A1 * | 6/2007 | Callegari et al. | 257/369 |

* cited by examiner

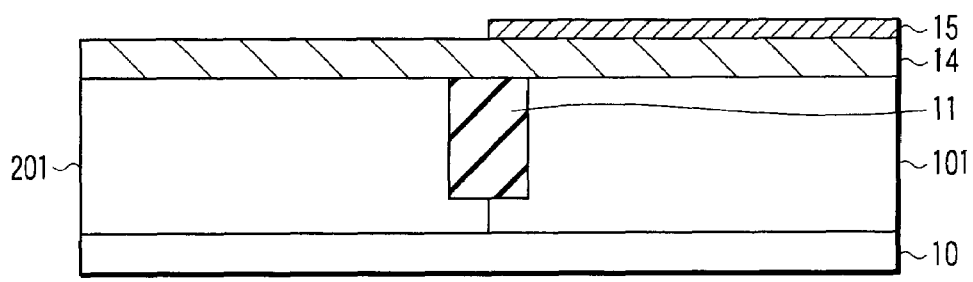
F I G. 10A
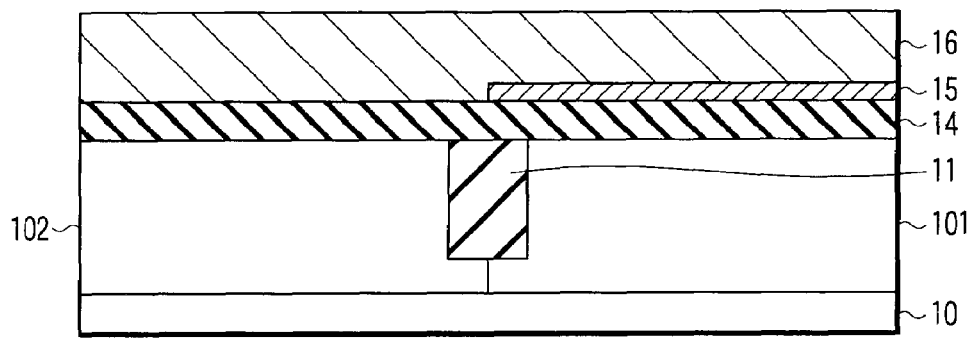
F I G. 10B
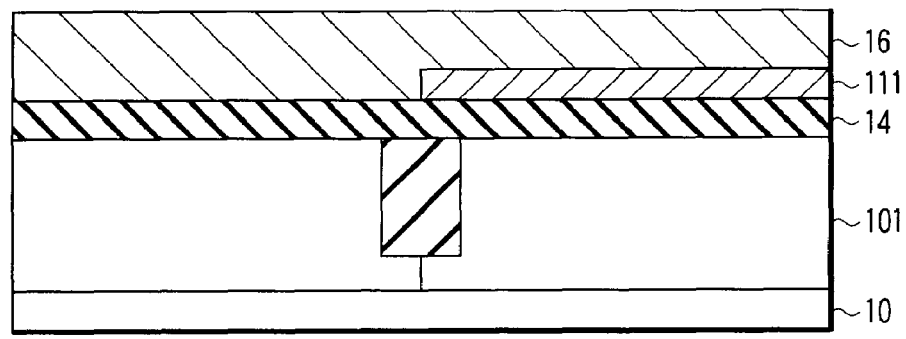
F I G. 10C
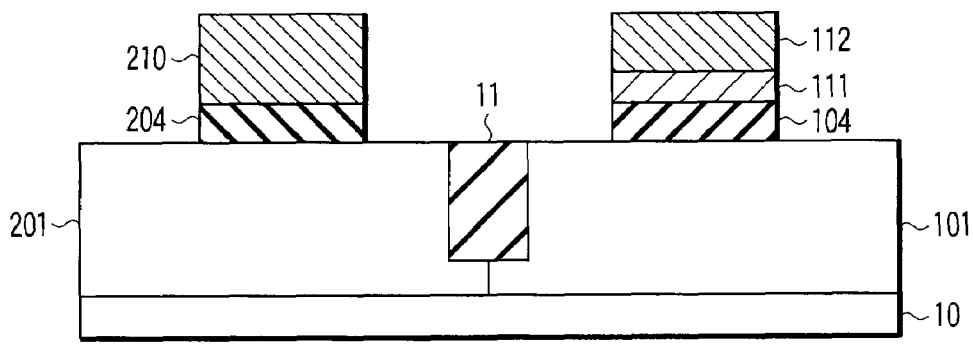
F I G. 10D

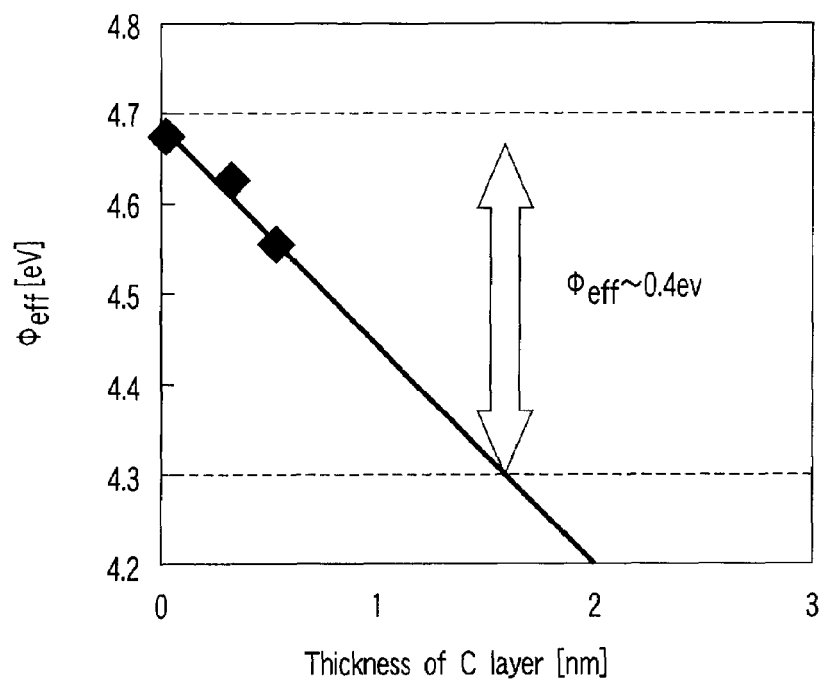
F I G. 12
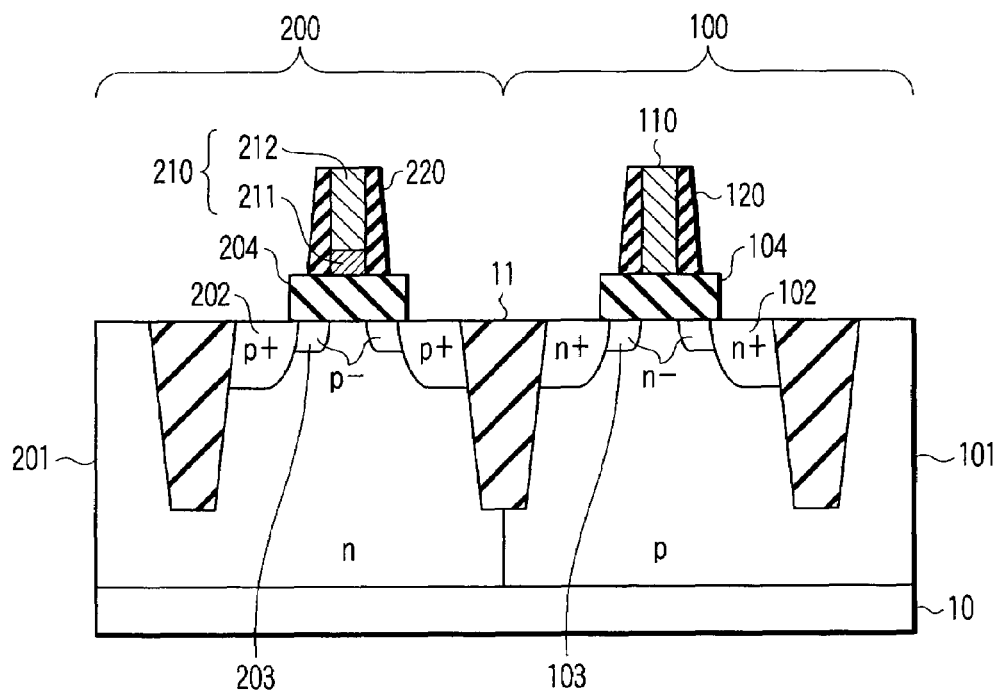
F I G. 13

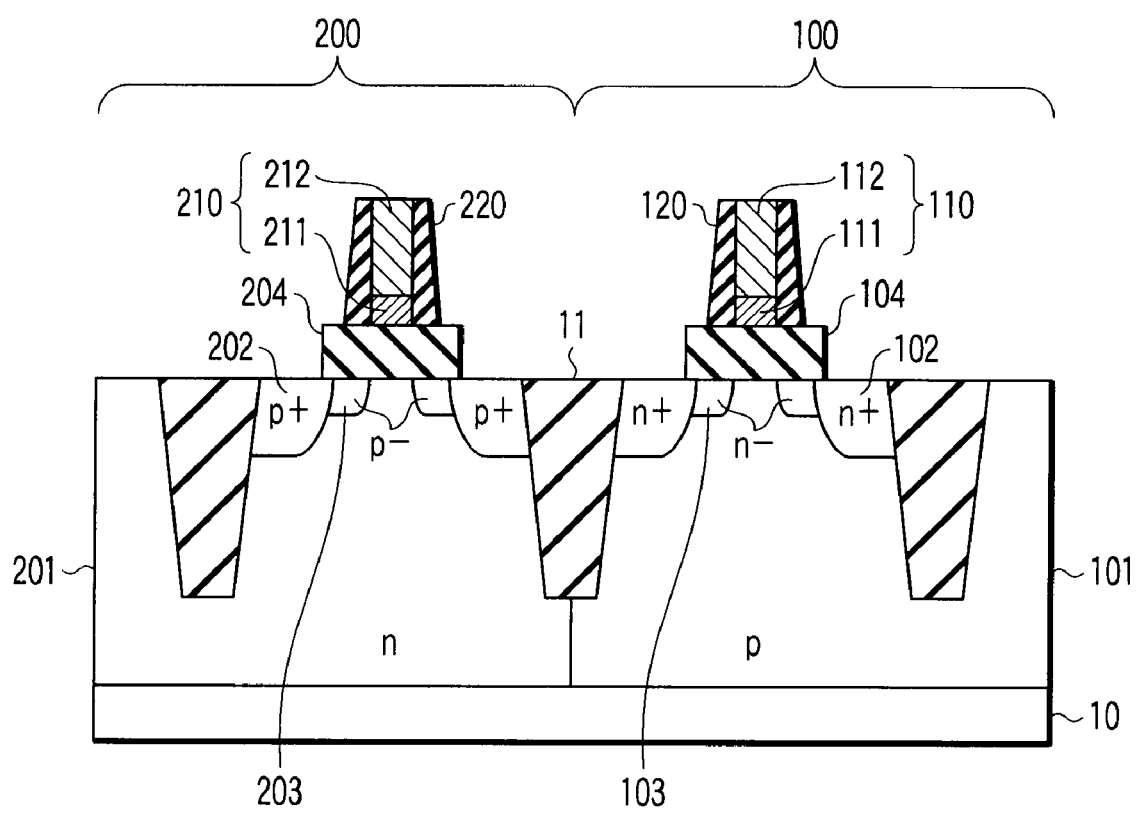
F I G. 15

SEMICONDUCTOR DEVICE

CROSS-REFERENCE TO RELATED APPLICATIONS

This application is based upon and claims the benefit of priority from prior Japanese Patent Application No. 2006-329521, filed Dec. 6, 2006, the entire contents of which are incorporated herein by reference.

BACKGROUND OF THE INVENTION

1. Field of the Invention

This invention relates to a semiconductor device where a p-channel Metal Insulator Semiconductor (MIS) transistor and an n-channel MIS transistor each of which has a metal gate have been formed on the same substrate.

2. Description of the Related Art

Recently, attention has been focused on the metal gate techniques for using metal as gate electrode materials in a complementary MIS (CMIS) device where a p-channel MIS transistor and an n-channel MIS transistor are formed on the same substrate. Since metal has as high a charge density as an atom density, when metal is used as a gate electrode, the depletion of the gate electrode can be ignored.

In a CMIS device using a metal gate electrode, a so-called dual-metal-gate CMIS structure is needed to realize a low threshold voltage. To form a dual-metal-gate CMIS structure, the gate electrode of each of the n-channel MIS transistor and p-channel MIS transistor is needed to have an effective work function close to the conduction band end and valence band end of Si. Specifically, the effective work function of the gate electrode of the p-channel MIS transistor is required to be 0.4 eV or more higher than the effective work function of the n-channel MIS transistor. At present, a general method of realizing this is to configure the gate electrode of the n-channel MIS transistor and that of the p-channel MIS transistor using completely different metal materials (e.g., refer to JP-A 2004-207481 (KOKAI) and U.S. Pat. No. 7,030,430).

However, when different metal materials are used for the gate electrode of the n-channel MIS transistor and that of the p-channel MIS transistor, the n-channel MIS transistor and p-channel MIS transistor have to be dealt with separately in forming and processing their gate electrodes. This makes the manufacturing processes complex and causes the problem of increasing the manufacturing cost. In the method disclosed in JP-A 2004-207481 (KOKAI), the work function of each gate electrode is made different by using molybdenum as gate electrode material for the p-channel MIS transistor and n-channel MIS transistor and at the same time introducing carbon into one of them. In this case, the manufacturing process is complicated.

To realize the introduction of metal gate techniques, it is necessary to find such a dual-metal-gate CMIS structure as prevents the manufacturing processes from becoming complicated as much as possible.

As described above, the introduction of dual-metal-gate techniques is indispensable for improving the performance of CMIS devices. To realize this, it is necessary to cause the metal material for the gate electrode of the n-channel MIS transistor to differ from that for the gate electrode of the p-channel MIS transistor, which is the factor that makes the manufacturing processes complex and increases the manufacturing cost.

BRIEF SUMMARY OF THE INVENTION

According to an aspect of the invention, there is provided a semiconductor device with MIS transistors, comprising: an n-channel MIS transistor which is formed on a substrate and which includes a p-type semiconductor region formed on the substrate, a first gate insulating film formed on the p-type semiconductor region, a first lower layer gate electrode which is formed on the first gate insulating film and whose film thickness is one monolayer or more and 3 nm or less, and a first upper layer gate electrode which is formed on the first lower layer gate electrode, whose average electronegativity is 0.1 or more smaller than the average electronegativity of the first lower layer gate electrode, and which is made of metal material; and a p-channel MIS transistor which is formed on the substrate and which includes an n-type semiconductor region formed on the substrate, a second gate insulating film formed on the n-type semiconductor region, and a second gate electrode which is formed on the second gate insulating film and is made of the metal material.

According to another aspect of the invention, there is provided a semiconductor device with MIS transistors, comprising: an n-channel MIS transistor which is formed on a substrate and which includes a p-type semiconductor region formed on the substrate, a first gate insulating film formed on the p-type semiconductor region, and a first gate electrode which is formed on the first gate insulating film and is made of metal material; and a p-channel MIS transistor which is formed on the substrate and which includes an n-type semiconductor region formed on the substrate, a second gate insulating film formed on the n-type semiconductor region, a second lower layer gate electrode which is formed on the second gate insulating film and whose film thickness is one monolayer or more and 3 nm or less, and a second upper layer gate electrode which is formed on the second lower layer gate electrode, whose average electronegativity is 0.1 or more greater than the average electronegativity of the second lower layer gate electrode, and which is made of the metal material.

According to still another aspect of the invention, there is provided a semiconductor device comprising: a substrate; an n-channel MIS transistor which includes a p-type semiconductor region formed on the substrate, a first gate insulating film formed on the p-type semiconductor region, a first lower layer gate electrode which is formed on the first gate insulating film and whose film thickness is one monolayer or more and 3 nm or less, and a first upper layer gate electrode which is formed on the first lower layer gate electrode, whose average electronegativity is smaller than the average electronegativity of the first lower layer gate electrode, and which is made of metal material; and a p-channel MIS transistor which includes an n-type semiconductor region formed on the substrate, a second gate insulating film formed on the n-type semiconductor region, a second lower layer gate electrode which is formed on the second gate insulating film and whose film thickness is one monolayer or more and 3 nm or less, and a second upper layer gate electrode which is formed on the second lower layer gate electrode, whose average electronegativity is greater than the average electronegativity of the second lower layer gate electrode, and which is made of the metal material, wherein the sum of the absolute value $\Delta\chi(1)$ of the average electronegativity difference between the first lower layer gate electrode and the first upper layer gate electrode and the absolute value $\Delta\chi(2)$ of the average electronegativity difference between the second lower layer gate electrode and the second upper layer gate electrode is 0.1 or more.

BRIEF DESCRIPTION OF THE SEVERAL VIEWS OF THE DRAWING

FIGS. 10A to 10D are sectional views showing the manufacturing processes of a semiconductor device according to the first embodiment;

FIG. 12 is a characteristic diagram showing the relationship between the film thickness of a C layer deposited on the gate insulating film and its work function;

FIG. 13 is a sectional view showing a schematic structure of a semiconductor device according to a second embodiment;

FIG. 15 is a sectional view showing a schematic structure of a semiconductor device according to a third embodiment.

DETAILED DESCRIPTION OF THE INVENTION

Overview and Principle of the Invention

Before the explanation of embodiments of the invention, the principle of the invention will be described.

The effective work function $\Phi_{eff}$ of a gate electrode is expressed by the following equation (1):

$$\Phi_{eff} = \Phi_{bulk} + \Phi_{interface} \quad (1)$$

Figure 1:
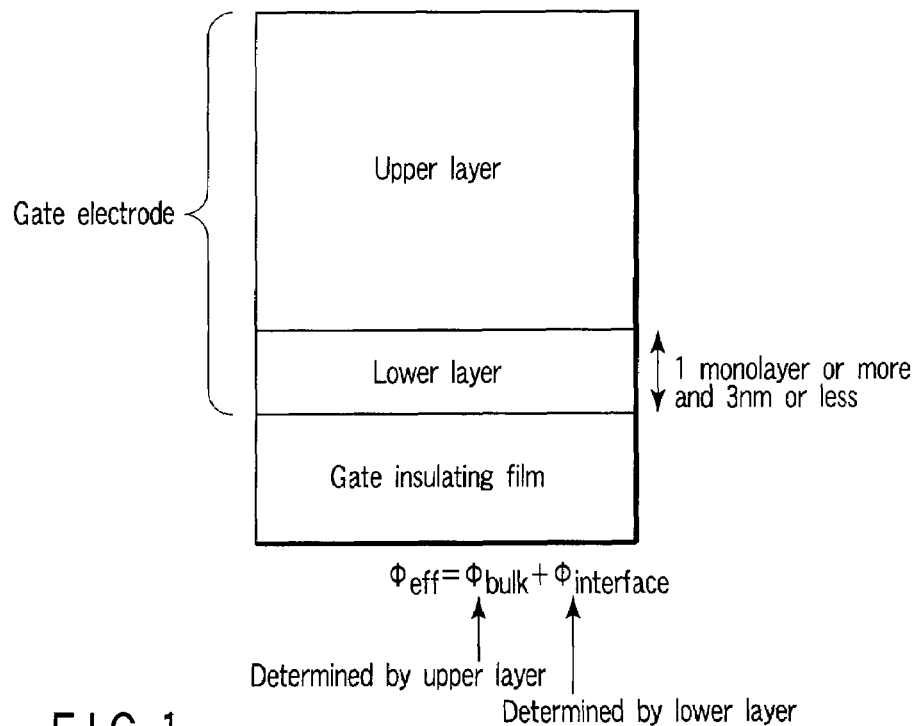
FIG. 1 shows the relationship between the structure of a gate electrode and the effective work function in the structure.

$\Phi_{bulk}$ is determined by the nature of the bulk part of the gate electrode. $\Phi_{interface}$ is a term determined by the charge distribution at the gate electrode/gate insulating film interface. Suppose there is a gate electrode with a stacked structure including a two-layer structure composed of a lower layer formed on the gate insulating film surface and an upper layer formed on the lower layer. At this time, as shown in FIG. 1, when the film thickness of the lower layer is 1 monolayer or more and 3 nm or less, $\Phi_{bulk}$ is determined mainly by the nature of the upper layer, whereas $\Phi_{interface}$ is determined by the nature of the lower layer.

$\Phi_{interface}$ depends on the size of a dipole formed when atoms on the gate electrode side combine with atoms on the gate insulating film side. Here, consider a case where the gate electrode is composed of Ta—C alloy and the gate insulating film is composed of oxide.

Figure 2:
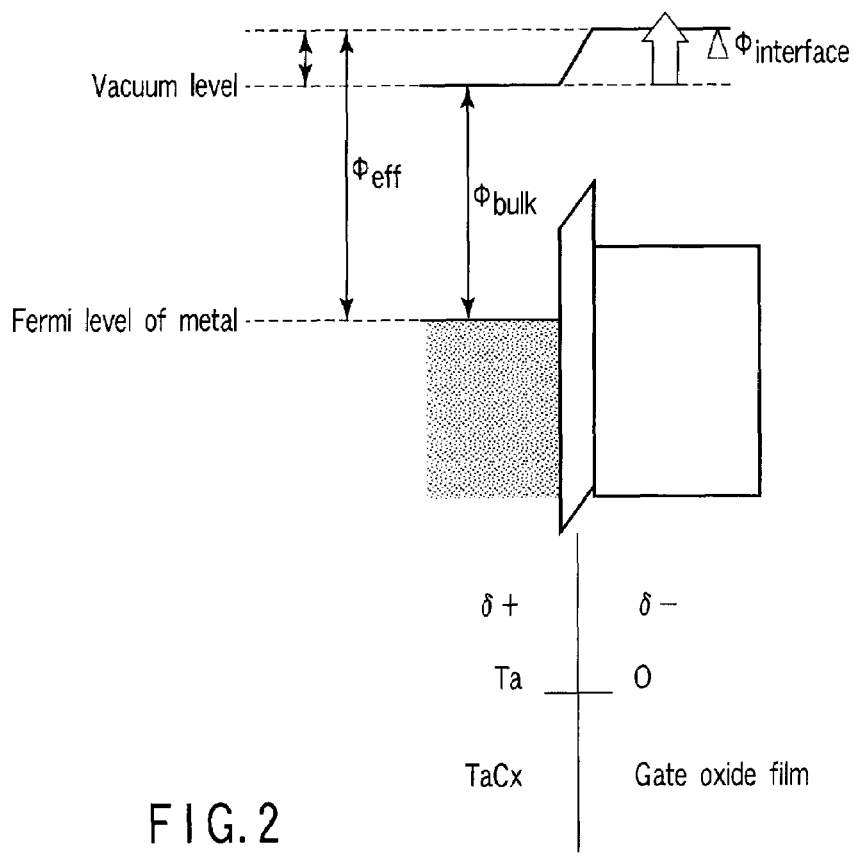
FIG. 2 shows an energy band when a dipole is formed at a gate electrode/gate insulating film interface.

FIG. 2 shows an energy band when tantalum (Ta) on the gate electrode side is combined with oxygen (O) on the gate insulating film side. Since the electronegativity $\chi$ of Ta is 1.5 and the electronegativity $\chi$ of O is 3.5, if Ta is combined with O, more electrons gather around O with a higher electronegativity $\chi$, that is, on the gate insulating film side. At that time, $\Phi_{interface}$ rises and $\Phi_{eff}$ increases as shown in FIG. 2.

Consider a case where C on the gate electrode side is combined with O on the gate insulating film side. At this time, the electronegativity $\chi$ of C is 2.5, having a stronger electron attracting force than Ta. Therefore, the cluster of electrons on the insulating film side is smaller than when the Ta—O combination is formed. Accordingly, $\Phi_{interface}$ is smaller that much.

What has been explained above is described more commonly as follows. If gate insulating films are the same, the more atoms whose electronegativity $\chi$ is small there are on the gate insulating film side of the gate electrode (that is, the smaller the average $\chi$ on the gate insulating film side of the gate electrode is), the greater $\Phi_{interface}$ is, whereas the more atoms whose electronegativity $\chi$ is large there are at the gate insulating film on the gate electrode side (that is, the greater the average $\chi$ of the gate electrode is), the smaller $\Phi_{interface}$ is. In the specification, the average $\chi$ means a geometric mean of the electronegativity of elements constituting metal materials. For example, the average $\chi$ of $Ta_xC_y$ is expressed as:

$$\chi = \sqrt[x+y]{\chi_{Ta}^x \chi_C^y} \quad (2)$$

$\chi Ta$ and $\chi C$ are the electronegativity of Ta and that of C, respectively.

Figures 3A, 3B:
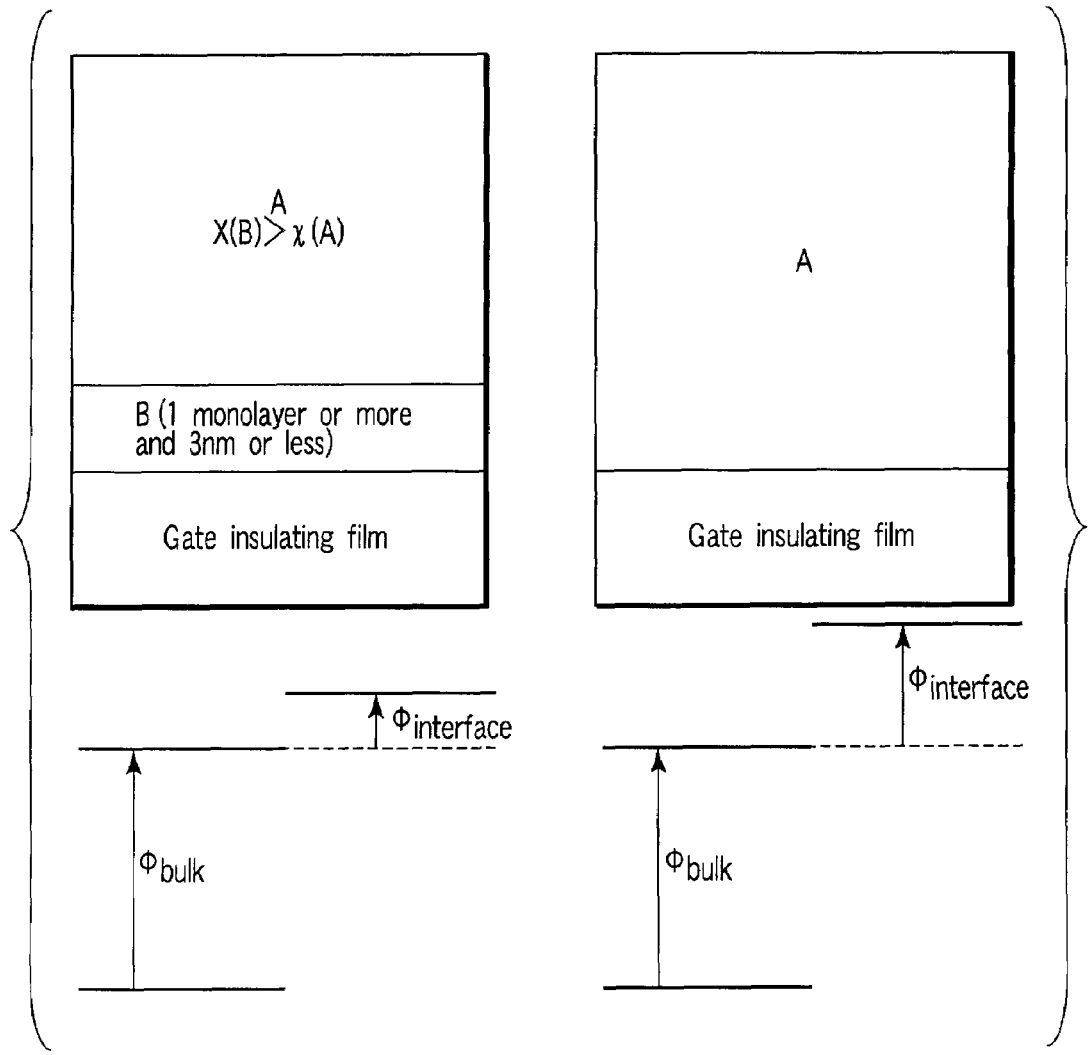
FIG. 3A shows the relationship between the structure (stacked layer) of the gate electrode and its effective work function.
FIG. 3B shows the relationship between the structure (single layer) of the gate electrode and its effective work function.
Figures 4A, 4B:
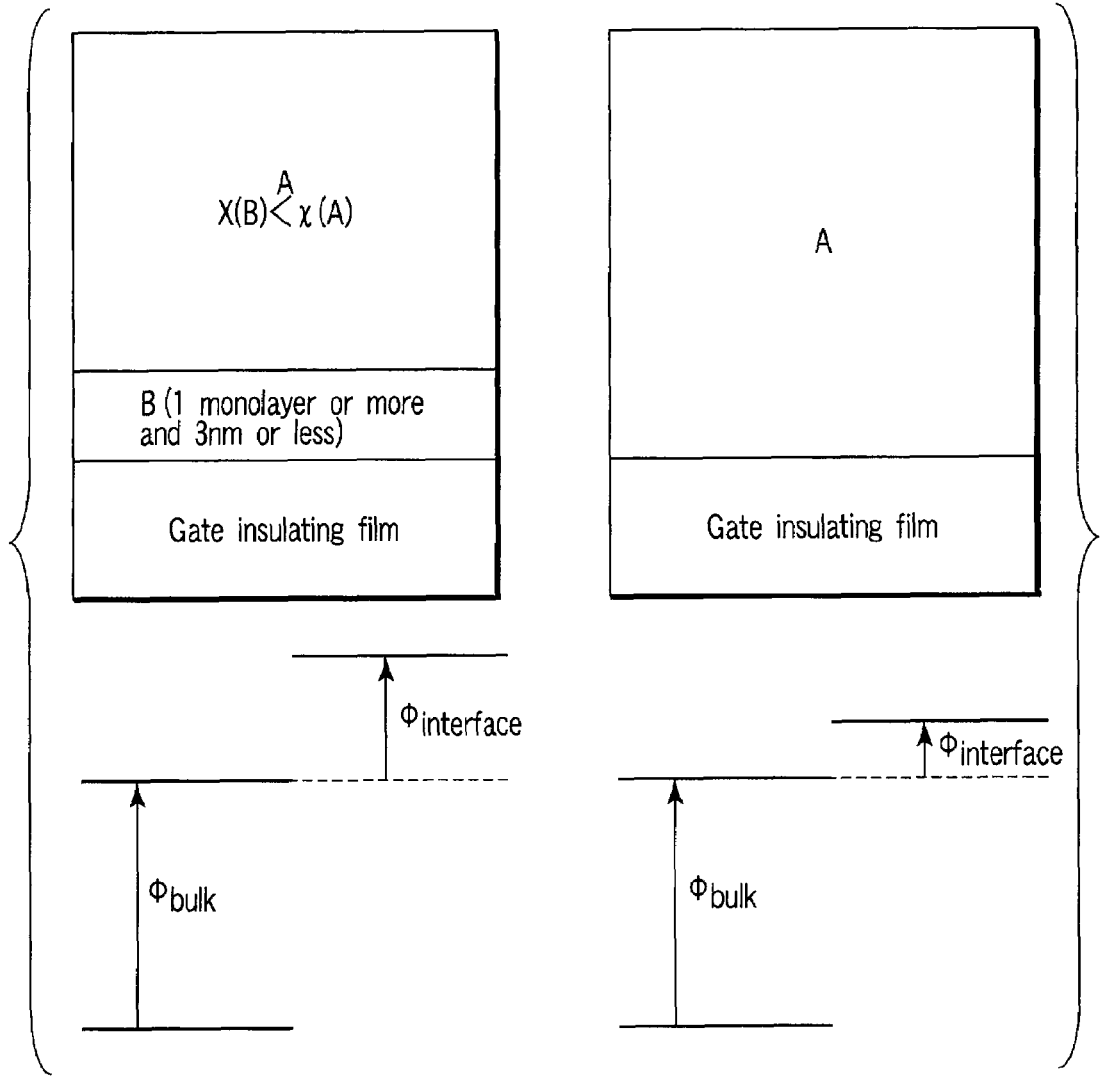
FIG. 4A shows the relationship between the structure (stacked layer) of the gate electrode and its effective work function.
FIG. 4B shows the relationship between the structure (single layer) of the gate electrode and its effective work function.

For the reason above-mentioned, as shown in FIGS. 3A and 3B, if the average $\chi$ of the gate electrode lower layer (B) is greater than the $\chi$ of the gate electrode upper layer (A), $\Phi_{interface}$ of the gate electrode composed of a A/B stacked structure is smaller than $\Phi_{interface}$ of the gate electrode composed of an A single layer. In contrast, if the average $\chi$ of the gate electrode lower layer (B) is smaller than the average $\chi$ of the gate electrode upper layer (A), as shown in FIGS. 4A and 4B, $\Phi_{interface}$ of the gate electrode composed of an A/B stacked structure is greater than $\Phi_{interface}$ of the gate electrode composed of an A single layer.

Generally, the greater $\chi$ is, the greater $\Phi_{bulk}$ is. For this reason, when the gate electrode lower layer (B) also has an effect on $\Phi_{bulk}$, the effect on $\Phi_{bulk}$ and the effect on $\Phi_{interface}$ cancel out each other. Therefore, the gate electrode lower layer (B) has to function only as $\Phi_{interface}$. As described above, this will be realized if the thickness of the gate electrode lower layer (B) is 1 monolayer or more and 3 nm or less. At that time, a difference in $\Phi_{interface}$ is reflected directly in $\Phi_{eff}$.

The inventors have examined what $\Phi_{eff}$ difference occurred when the gate electrode was composed of a stacked structure. The result of the examination has shown that, if the absolute value Δχ of the difference between the average χ of the gate electrode upper layer (A) and the average χ of the gate electrode lower layer (B) is 0.1 or more, the $\Phi_{eff}$ difference ($\Delta\phi_{eff}$) between the MIS transistor composed of an A single layer and the MIS transistor composed of an A/B stacked layer is 0.4 eV or more, which is required to realize a dual-metal-gate CMIS structure. Moreover, the inventors have found that $\Delta\phi_{eff}$ and Δχ have the following relationship:

$$\Delta\Phi_{eff}=0.4\times\Delta\chi/0.1 \quad (3)$$

Figure 5:
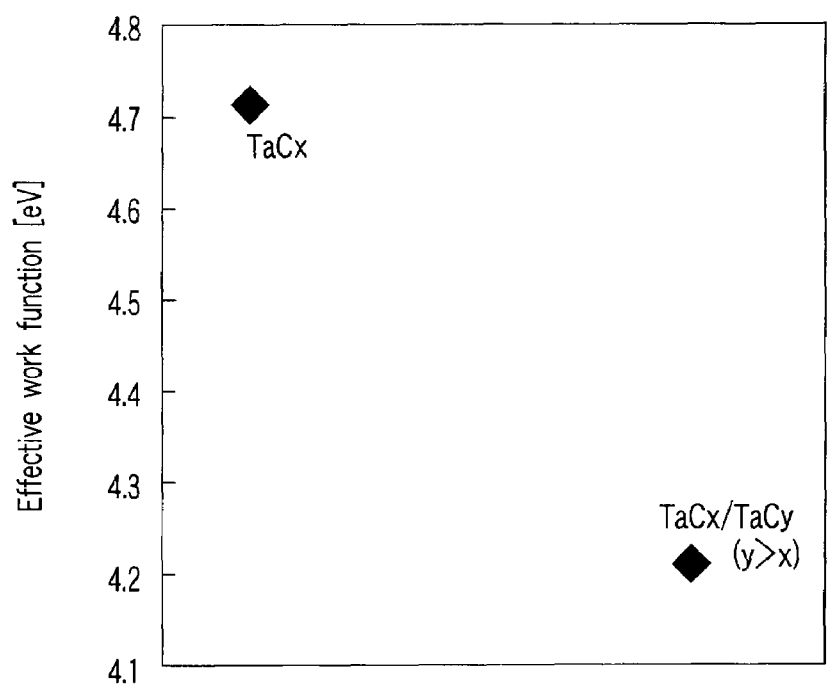
FIG. 5 shows an effective work function on $SiO_2$ at a $TaC_x$ electrode and that on $SiO_2$ at a $TaC_x/TaC_y$ electrode.

FIG. 5 shows actual measurement values of the effective work functions of a gate electrode composed of a stacked structure of $TaC_x/TaC_y$ (y>x) and a gate electrode composed of a $TaC_x$ single layer. Here, $SiO_2$ was used as the gate insulating film.

When the gate electrode was a $TaC_x$ single layer (M1), the effective work function was about 4.7 eV. When the gate electrode was a $TaC_x/TaC_y$ (y>x) (M2), the effective work function was about 4.2 eV. When the atom concentration of the gate electrode M1 and that of the gate electrode M2 were examined by a physical analysis, the result showed that the gate electrodes M1 and M2 had the same C atom concentration in a region 3 nm or more deeper than the gate insulating film/gate electrode interface. However, the C atom concentration in a region near the gate insulating film of the gate electrode was 52 at. % in the gate electrode M1 and 63 at. % in the gate electrode M2. When these are expressed using the average χ, this gives 1.96 for M1 and 2.07 for M2. There is a χ difference of 0.1 or more between M1 and M2, which satisfies the condition for obtaining a $\Phi_{eff}$ difference of 0.4 eV or more. This fact has shown the validity of the aforementioned principle.

Hereinafter, referring to the accompanying drawings, embodiments of the invention will be explained. The configuration common to the individual embodiments are indicated by the same reference numerals and repeated explanations will be omitted.

First Embodiment

Figure 6:
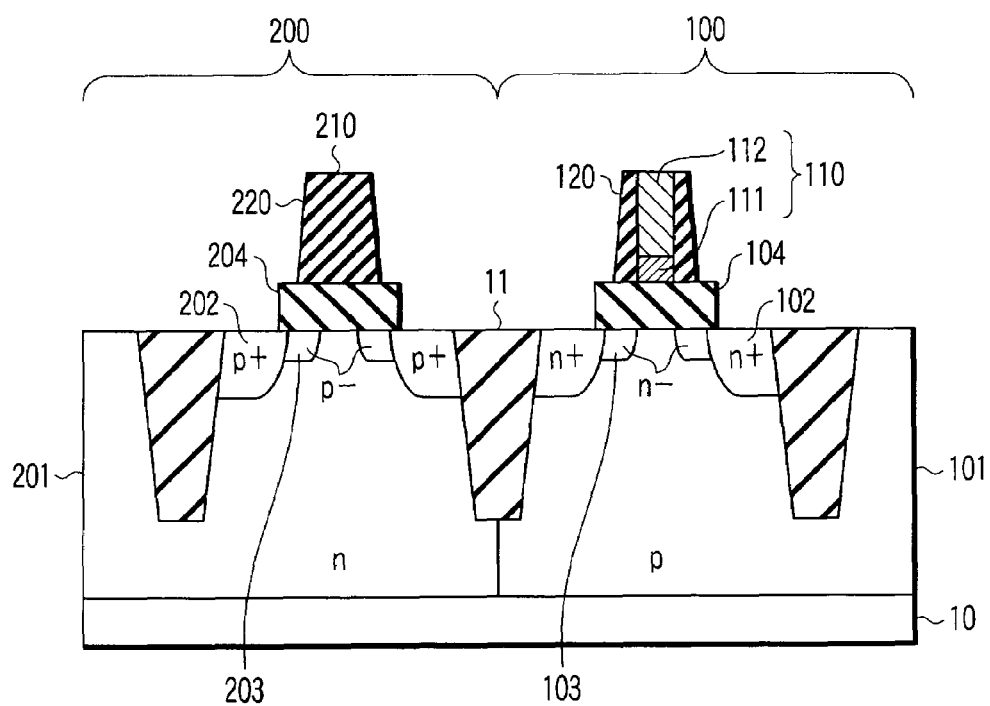
FIG. 6 is a sectional view showing a schematic structure of a semiconductor device according to a first embodiment.

FIG. 6 is a sectional view of a schematic structure of a semiconductor device with a dual-metal-gate CMIS structure.

At the surface of an Si substrate 10 as a semiconductor substrate, a p-type semiconductor region 101 and an n-type semiconductor region 201 are provided. In the p-type semiconductor region 101, an n-channel MIS transistor 100 is formed. In the n-type semiconductor region 201, a p-channel MIS transistor 200 is formed. The p-type semiconductor region 101 and n-type semiconductor region 201 are formed to function as so-called wells. At the boundary part between the regions 101 and 201, an element isolating region 11 to isolate them from each other is formed.

On the surface of the p-type semiconductor region 101, a first gate insulating film 104 composed of an Si oxide film is formed. On the gate insulating film 104, a first gate electrode 110 constituting a stacked structure is formed. A lower layer 111 (a first lower layer gate electrode) of the gate electrode 110 is composed of Ta—C alloy whose thickness is 1 monolayer or more and 3 nm or less. An upper layer (a first upper layer gate electrode) 112 is composed of Ta—C alloy. The average electronegativity χ of the lower layer gate electrode 111 is 0.1 or more greater than the average χ of the upper layer gate electrode 112. This is equivalent to the C atom concentration of the lower layer gate electrode 111 being 10 at. % or more higher than the C atom concentration of the upper-layer gate electrode 112.

On the surface of the n-type semiconductor region 201, a second gate insulating film 204 composed of an Si oxide film is formed. On the surface of the gate insulating film 204, a gate electrode (a second gate electrode) 210 composed of Ta—C alloy is formed. The gate electrode 210, whose material is the same as that of the first upper layer gate electrode 112, is formed at the same time the upper layer gate electrode 112 is formed.

On the gate electrode 210 and upper layer gate electrode 112, high melting point metal, such as W or TiN, may be formed. In FIG. 6, the remaining configuration, including an element isolating region 11, source/drain regions 102,202, extension regions 103, 203, and gate sidewall insulating films 120, 220, can be formed by conventional semiconductor processes. The sidewall insulating films 120, 220 are made of the same material and formed at the same time.

Moreover, the gate insulating films 104, 204 are made of the same material and formed at the same time. The formative material of the gate insulating films 104, 204 is not necessarily limited to an Si oxide film and may be another insulating material. That is, the first embodiment is not restricted to a MOS structure and may be applied to a MIS structure.

Under the aforementioned principle, using the structure of the embodiment makes it possible to realize a dual-metal-gate CMIS structure using a metal gate. The lower layer gate electrode 111 of the gate electrode 110 of the n-channel MIS transistor 100 is very thin and the remaining gate electrode part (the upper layer gate electrode 112) is made of the same material as that of the gate electrode 210 of the p-channel MIS transistor 200. Therefore, the etching processes of gates can be carried out collectively, which makes it possible to simplify the manufacturing processes and reduces the manufacturing cost.

To lower the threshold voltages of both the n-channel MIS transistor 100 and the p-channel MIS transistor 200 sufficiently, it is desirable that the effective work function ($\Phi_{eff}$(N)) of the n-channel MIS transistor 100 should be 4.3 eV or less and the effective work function ($\Phi_{eff}$(P)) of the p-channel MIS transistor 200 should be 4.7 eV or more. In the first embodiment, the gate electrode 210 of the p-channel MIS transistor 200 is composed of a gate electrode single layer. Both $\Phi_{bulk}$ and $\Phi_{interface}$ are determined only by the nature of a single layer of TaC. Therefore, it is desirable that the gate electrode 210 should have an effective work function value of 4.7 or more.

The effective work function of the gate electrode 110 composed of a stacked structure on the n-channel MIS transistor 100 side is lower than the effective work function of the gate electrode 210 because of the electronegativity difference Δχ between the lower layer gate electrode 111 and upper layer gate electrode 112. For the effective work function $\Phi_{eff}$(N) of the gate electrode of the n-channel MIS transistor 100 to be 4.3 eV or lower, it is seen from equation (3) that Δχ has to satisfy the following expression:

$$\Phi_{eff}(P)-0.4\times\Delta\chi/0.1\leq 4.3 \quad (4)$$

The structure of the gate electrode on the gate insulating film side and the composition and thickness of the gate electrode can be examined by removing the MIS structure Si substrate and making XPS measurements (backside XPS measurements) via the gate insulating film. As the photoelectron detecting angle (TOA) in XPS measurements is made lower, information on the gate electrode in a region shallower than the gate insulating film/gate electrode interface is obtained. As TOA is made higher, information on the gate electrode in a region deeper than the gate insulating film/gate electrode interface is obtained. Therefore, changing TOA makes it possible to examine the composition of the gate electrode at a desired depth from the gate insulating film/gate metal interface. The cross section structure of the gate electrode/gate insulating film can be analyzed by the TEM-EELS method.

The structure of the gate electrodes M1 and M2 in FIG. 5 used in explaining the principle and its composition and thickness were obtained from backside XPS measurements.

Furthermore, $TaC_x$ with a strong TaC (111) orientation is used effectively as the gate electrode 210 of the p-channel MIS transistor 200. The reason is that the effective work function of crystallized $TaC_x$ depends on its crystal face and the TaC (111) plane has a particularly high effective work function. This is because the plane in contact with the insulating film is the TaC (111) plane, $\Phi_{interface}$ is large. If the crystalline orientation rate [TaC (111) plane/{TaC (111) plane+TaC (200) plane}] is 80% or more, it is known that the effect will be obtained.

That is, the gate electrode 210 of the p-channel MIS transistor 200 is composed of $TaC_x$ where the crystalline orientation rate [TaC (111) plane/{TaC (111) plane+TaC (200) plane}] is 80% or more, the effective work function of the gate electrode 210 of the p-channel MIS transistor 200 is greater than the effective work function when uncrystallized Ta—C alloy is used. For this reason, the difference between the effective work function of the gate electrode 110 of the n-channel MIS transistor 100 and the effective work function of the gate electrode 210 of the p-channel transistor 200 can be obtained more easily.

Even if in the n-channel MIS transistor 100, $TaC_x$ with a strong TaC (111) orientation is used as the upper layer gate electrode 112, the effective work function will not become greater as a result control of orientation since the upper layer gate electrode 112 is not directly in contact with the gate insulating film 104.

The fact that the work function can be changed by controlling the crystalline orientation has been found and already proposed by the inventors (JP-A 2007-165414 (KOKAI)). Hereinafter, the proposition will be explained briefly.

Since the work function of a $TaC_x$ electrode was 4.18 eV in the prior art, a $TaC_x$ electrode was generally used only in an n-channel MIS transistor. Even if conventional $TaC_x$ were used for the gate electrode of a p-channel MIS transistor, its threshold voltage would be very high and therefore the CMIS could not operate properly.

The inventors set the Ta—C composition ratio (C/Ta) to 0.5 to 1.5 and used $TaC_x$ in a crystallized state. Furthermore, the inventors has newly found that making (111) orientation stronger enables a work function of about 4.8 eV close to $p^+$ silicon to be obtained and increasing the (200) orientation component for (111) orientation enables a work function close to $n^+$ silicon to be obtained. Then, this was applied to the dual metal gate of the CMIS transistor.

Figure 7:
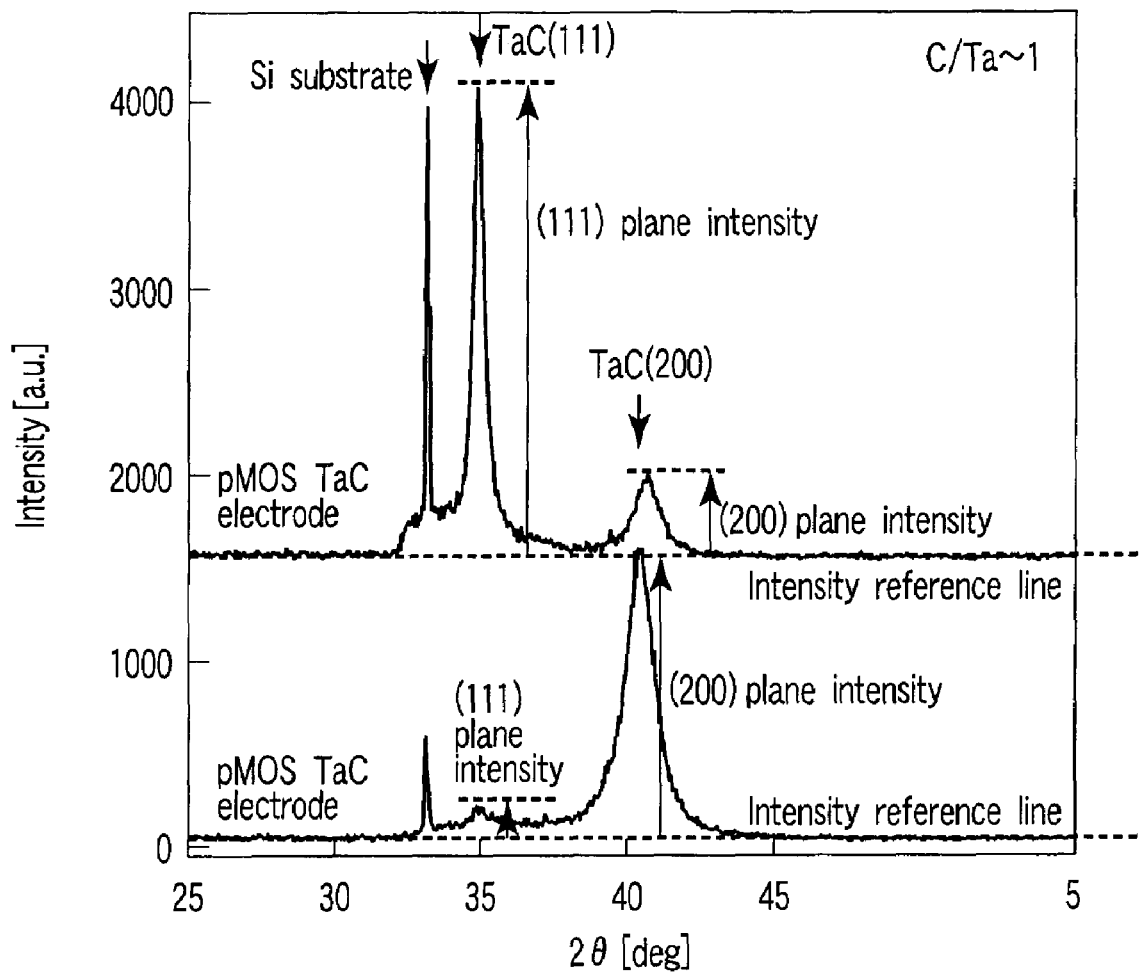
FIG. 7 is a characteristic diagram showing a change in the orientation of a $TaC_x$ electrode according to a difference in the film forming method.

FIG. 7 shows the result of the experiments to examine the crystalline characteristics of a $TaC_x$ thin film of 100 nm in film thickness. The abscissa indicates angles (2θ) and the ordinate indicates strength. To make it possible to distinguish between the characteristic of a pMIS TaC electrode and that of a nMIS TaC electrode, offsetting is done in the ordinate direction. Both of them have a $TaC_x$ film composition of C/Ta to 1. Depending on a difference in the film forming method, the $TaC_x$ films were divided into those with the strongest (111) diffraction peak and those with the strongest (200) diffracting peak.

The above description has shown the result of using an analysis sample of a TaC film/gate insulating film/Si substrate. Such experiments can, of course, be performed on a finished transistor. In that case, the gate electrode part of the transistor is cut off by the pickup method used in TEM observation and the cross section of the gate electrode is analyzed by an electron diffraction method, which makes it possible to verify the ratio of (111) orientation to (200) orientation. In this case, since an electron beam in the TEM method is used, the positioning accuracy of the analysis position is high. This makes it easy to verify the orientation of the TaC film in the region in contact with the gate insulating film strongly related to actual threshold voltage control.

Figure 8:
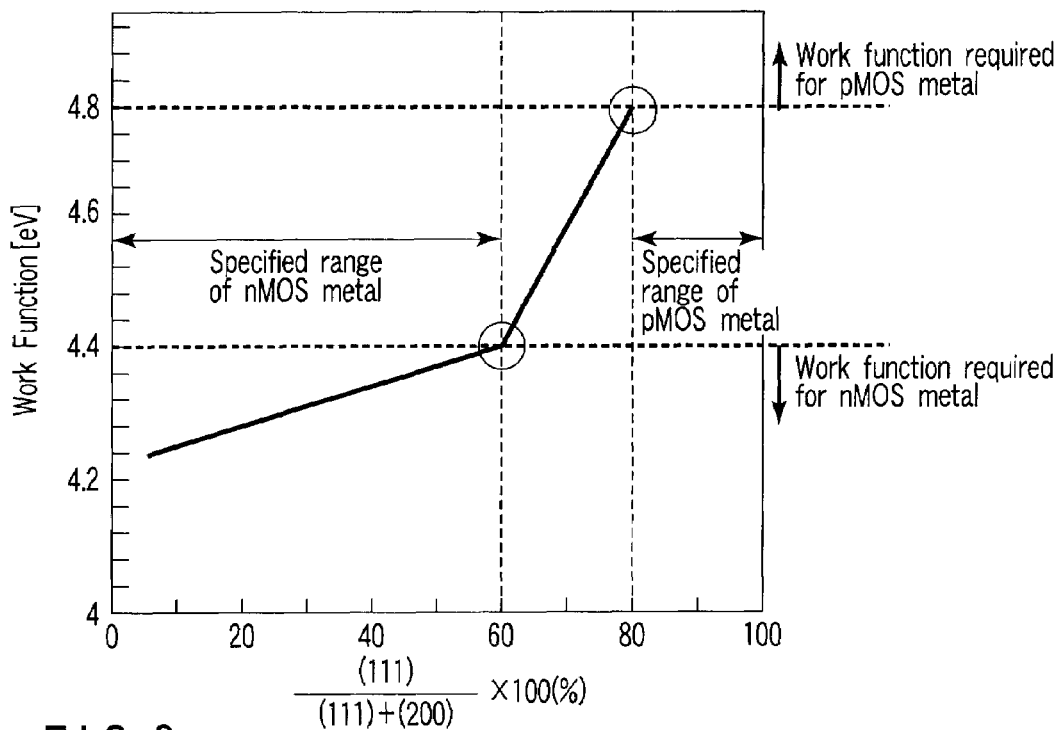
FIG. 8 is a characteristic diagram showing the relationship between the orientation of the $TaC_x$ electrode and its work function.

FIG. 8 shows a change in the work function when the orientation is changed as described above. Since $TaC_x$ presents a work function of 4.75 eV or more equivalent to that of $p^+$ silicon, it is seen that the crystalline orientation rate of the (111) plane shown in expression (5) below has to be 80% or more:

$$\text{Tac(111)peak intensity}/\{\text{TaC(111)peak intensity} + \text{TaC(200)peak intensity}\} \times 100 \quad (5)$$

Figure 9:
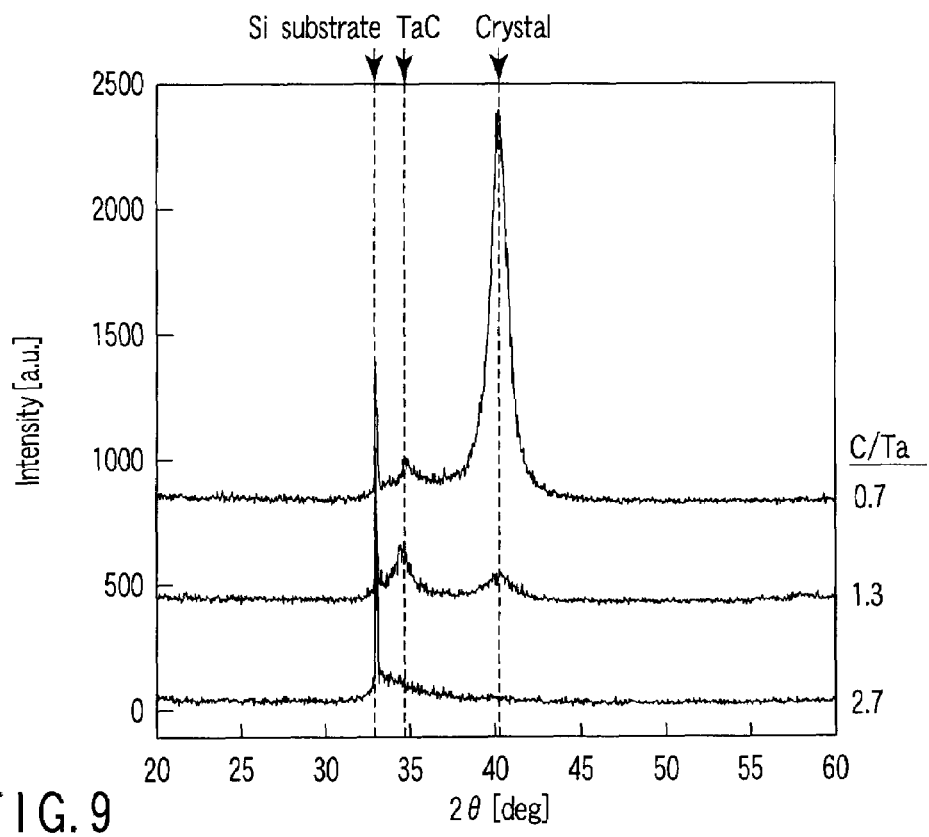
FIG. 9 is a characteristic diagram showing the relationship between the composition of the $TaC_x$ electrode and a crystalline change.

Here, the (111) plane crystalline orientation rate is calculated from expression (5) by determining the absolute value of the TaC (111) peak intensity and TaC (200) peak intensity from the XRD spectrum in FIG. 9. In place of the peak intensity, a peak area may be used. When the (111) plane crystalline orientation rate is determined, the direction perpendicular to the plane adjacent to the gate insulating film of the gate electrode, that is, the direction of the film thickness of the gate electrode, is used as a reference.

As described above, $TaC_x$ with a strong TaC (111) orientation is used effectively as the gate electrode 210 of the p-channel MIS transistor 200.

Since TaC is used as gate electrode material, the first embodiment has the following advantage.

As for Ta and C used as gate electrode materials in the first embodiment, the electronegativity $\chi$ of Ta is 1.5 and the electronegativity $\chi$ of C is 2.5, with the result that the difference in $\chi$ between them is large. This means that changing the C composition percentage in $TaC_x$ enables the average electronegativity $\chi$ to be changed greatly. For example, suppose Mo is used in place of Ta. Since the $\chi$ of Mo is 2.16 close to that of C, even if the C composition percentage in $MoC_x$ is changed, the average electronegativity $\chi$ cannot be changed greatly.

Since TaC has excellent heat resistance, it is suitable for gate electrode material. As described above, if a material in which the electronegativity difference between the individual atoms is large as in TaC and which has excellent heat resistance can be used as a gate electrode material. In addition to TaC, TiC, TaN and TiN may be used.

Furthermore, the lower layer gate electrode 111 of the gate electrode 110 of the n-channel MIS transistor 100 may be composed of Ta—C alloy including impurity atoms. Putting impurity atoms whose electronegativity is higher than that of C in the part of the lower layer gate electrode 111 makes it easier to set the average electronegativity difference between the lower layer gate electrode 111 and upper layer gate electrode 112 to 0.1 or more. For this reason, N, O, F, P, S, Cl, As, Se, Br, and I can be used as impurity atoms. Of them, F, P, and As are particularly preferred because they are established as general impurity dopant in semiconductor manufacturing processes.

Next, an example of a semiconductor device manufacturing method according to the first embodiment will be explained with reference to FIGS. 10A to 10D.

First, as shown in FIG. 10A, after a p-type semiconductor region 101 and an n-type semiconductor region 201 isolated with an element isolating region 11 are formed on an Si substrate 10, gate insulating films 14 (104, 204) are formed at the substrate surface. The gate insulating film may be an oxide film, such as $SiO_2$, or a high dielectric film. Hafnium nitride silicate (e.g., HfSiON), lanthanum hafnate (e.g., $La_2Hf_2O_7$), and lanthanum aluminate (e.g., $LaAlO_3$) are particularly preferred. Amorphous materials are more preferred. Then, a C layer 15 is selectively deposited only on the gate insulating film 104 on the n-channel MIS transistor 100 side.

Next, as shown in FIG. 10B, on the gate insulating film 14 on the p-channel MIS transistor 200 side and on the C layer 15 on the n-channel MIS transistor 100 side, Ta—C alloys 16 (112, 210) are formed simultaneously.

Figure 11A:
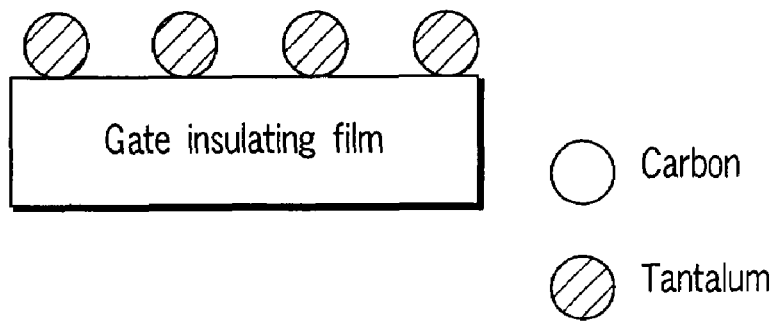
FIGS. 11A to 11C are pattern diagrams to help explain a method of forming a pMIS $TaC_x$ electrode.
Figure 11B:
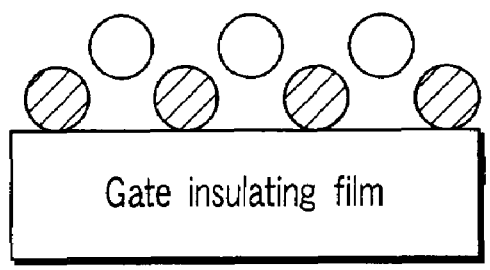
Figure 11C:
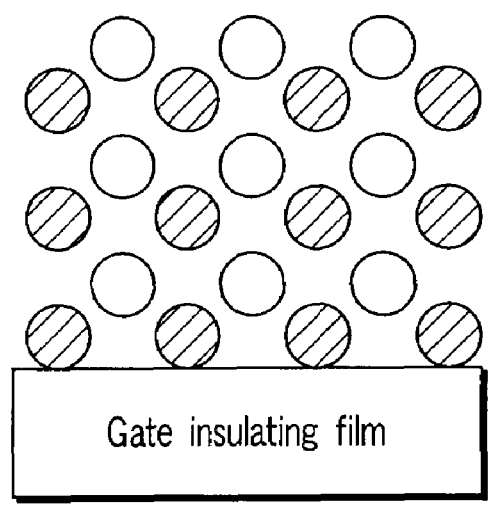

Here, the alternate arrangement of a Ta layer and a C layer in the film thickness direction is effective in forming a pMIS TaC electrode with (111) plane crystalline orientation rate of 80% or more efficiently as the Ta—C alloy 16. The principle of the film forming method is schematically shown in FIGS. 11A to 11C. Tac takes a cubical crystal structure. Its (111) plane has a structure where a Ta layer and a C layer are stacked alternately. Therefore, the same atomic position as that of a TaC (111) plane is formed intentionally, which enables a TaC thin film oriented to a (111) plane to be obtained more efficiently.

Such a manufacturing method can be realized by an ALD method. Specifically, a Ta source and a C source are supplied layer by layer alternately as shown FIGS. 11A to 11C. Here, relatively high vapor pressure materials, such as chloride series, amide series, or imide series, can be used as a Ta source. Acetylene, $CH_4$, $C_2H_4$, $CCl_4$, or CO can be used as a C source.

Furthermore, the aforementioned manufacturing method can be realized using sputtering techniques. In this case, a multi-cathode sputtering unit with a plurality of cathodes is used and a Ta target and a C target are installed. Sputtering for one layer of Ta target and sputtering for one layer of C target are performed alternately, thereby forming a pMIS TaC thin film.

Here, the formation of a film on the gate insulating film may be started with C or Ta, which does not have a great effect on the quality of (111) plane orientation.

Next, the structure shown in FIG. 10B is heat-treated to mix the C layer 15 and the Ta—C alloy 16 on the C layer 15, thereby forming a gate electrode lower layer 111, which produces a structure shown in FIG. 10C. Here, the composition of the gate electrode lower layer 111 can be controlled by the thickness of the C layer 15. Actually, the thicker the C layer 15, the C richer the composition of the gate electrode lower layer 111 becomes. As shown in FIG. 12, it has been verified that, if the thickness is 1.5 nm or more, the effective work function difference between the n-channel MIS transistor 100 and p-channel MIS transistor 200 is 0.4 eV or more.

However, if the gate electrode lower layer 111 formed by combining the C layer 15 and the Ta—C alloy of the upper electrode is 3 nm or more, the gate electrode lower layer also has an effect on $\Phi_{bulk}$ as described above. To avoid this, it is desirable that the thickness of the C layer 15 should be 2.5 nm or less. Although a method of depositing the C layer 15 is not limited in particular, it is desirable to use an atomic layer deposition (ALD) method capable of forming uniform thin films. Although a method of forming a Ta—C alloy 16 is not limited in particular, for example, CVD techniques, vapor-deposition techniques, or sputtering techniques may be used.

Next, by lithography and etching, such as RIE, the gate insulating film 14, Ta—C alloy 16 and the gate electrode lower layer 111 are processed simultaneously with the n-channel MIS transistor 100 and p-channel MIS transistor 200, which produces a structure shown in FIG. 10D.

From this point on, by known processes, extension regions 103, 203 are formed at the surface of each of the semiconductor regions 101, 201 with the gate parts as a mask and then gate sidewall insulating films 120, 220 are formed. Then, with the gate parts and sidewall insulating films 120, 220 as a mask, source/drain regions 102, 202 are formed at the surfaces of the semiconductor regions 101, 201 respectively, which produces a structure shown in FIG. 6.

As described above, with the first embodiment, in the dual-metal-gate CMIS structure where the n-channel MIS transistor 100 and p-channel MIS transistor 200 have been formed on the substrate, TaC is used as a gate electrode material, the gate electrode 110 of the n-channel MIS transistor 100 is caused to have a stacked structure of the lower layer gate electrode 111 and upper layer gate electrode 112, the average electronegativity of the upper layer gate electrode 112 is made 0.1 or more smaller than the average electronegativity of the lower layer gate electrode 111, and the metal material of the gate electrode 210 of the p-channel MIS transistor 200 is the same as that of the upper layer gate electrode 112 of the n-channel MIS transistor 100. With this configuration, the effective work function of the gate electrode 210 of the p-channel MIS transistor 200 can be made 0.4 eV or more higher than the effective work function of the gate electrode 110 of the n-channel MIS transistor 100.

In this case, since the upper layer gate 112 of the n-channel MIS transistor 100 and the gate electrode 210 of the p-channel MIS transistor 200 have both the same composition of TaC and the lower layer gate electrode 111 of the n-channel MIS transistor 100 is very thin, the etching processes of the gates can be carried out collectively. Furthermore, although the lower layer electrode 111 of the n-channel MIS transistor 100 is made of TaC and differs in composition from the upper layer gate electrode 112 of the n-channel MIS transistor 100 and the gate electrode 210 of the p-channel MIS transistor 200, they are the same in constituent elements. Therefore, when electrodes are formed, another material is not needed. Accordingly, it is possible to simplify the manufacturing processes and reduce the manufacturing cost.

Second Embodiment

FIG. 13 is a sectional view showing a schematic structure of a semiconductor device with a dual-metal-gate CMIS structure.

A first gate insulating film 104 is formed at the surface of a p-type semiconductor region 101. On the surface of the gate insulating film 104, a gate electrode (a first gate electrode) 110 made of Ta—C alloy is formed.

A second gate insulating film 204 is formed at the surface of an n-type semiconductor region 201. On the gate insulating film 204, a second gate electrode 210 with a stacked structure is formed. A lower layer (a second lower layer gate electrode) 211 of the gate electrode 210 is made of Ta—C alloy whose thickness is 1 monolayer or more and 3 nm or less. An upper layer (a second upper layer gate electrode) 212 of the gate electrode is made of Ta—C alloy. Here, the average electronegativity $\chi$ of the lower layer gate electrode 211 is 0.1 or more smaller than the average electronegativity $\chi$ of the upper layer gate electrode 212. This is equivalent to the C atom concentration of the lower layer gate electrode 211 being 10 at. % or more lower than the C atom concentration of the upper layer gate electrode 212.

On the gate electrode 110 and upper layer gate electrode 212, high melting point metal, such as W or TiN, may be further formed. In FIG. 13, the remaining configuration, including element isolating regions 11, source/drain regions 102, 202, extension regions 103, 203, and gate sidewall insulating films 120, 220, can be formed by conventional semiconductor processes.

In contrast to the first embodiment described above, the second embodiment is such that the gate electrode 210 of the p-channel MIS transistor 200 has a stacked structure including an upper layer and a lower layer. Under the same principle as that of the first embodiment, a dual-metal-gate CMIS structure using metal gates can be realized.

Moreover, as in the first embodiment, the lower layer gate electrode 211 of the gate electrode 210 of the p-channel MIS transistor 200 is very thin and the remaining electrode part (the upper layer gate electrode 212) is the same as the gate electrode 110 of the n-channel MIS transistor 100. For this reason, the etching processes of the gates can be carried out collectively, which produces the same effect as that of the first embodiment.

Furthermore, in contrast to the first embodiment, the second embodiment is such that the gate electrode 110 of the n-channel MIS transistor 100 is composed of a gate electrode single layer and both $\Phi_{bulk}$ and $\Phi_{interface}$ are determined only by a single layer of TaC. For this reason, in the second embodiment, to fulfill the expressions $\Phi_{eff}(P) \geq 4.7$ eV and $\Phi_{eff}(N) \leq 4.3$ eV, it is seen from equation (3) that the gate electrode 110 has an effective work function of 4.3 or less and the absolute value $\Delta\chi$ of the average electronegativity difference between the gate electrode 110 and gate electrode 210 has to satisfy the following expression:

$$\Phi_{eff}(N) + 0.4 \times \Delta\chi/0.1 \geq 4.7 \quad (6)$$

In the second embodiment, $TaC_x$ with a strong TaC (100) orientation is used effectively as the gate electrode 110 of the n-channel MIS transistor 100. The low effective work function of the TaC (100) plane is used here. It is known that, when the crystalline orientation rate [TaC (111) plane/{TaC (111) plane+TaC (200) plane}] of the TaC (111) plane in the film thickness direction is 60% or less, the effective work function is sufficiently low under the influence of the TaC (100) plane. If the gate electrode 110 of the n-channel MIS transistor 100 is made of TaCx where the crystalline orientation rate [TaC (111) plane/{TaC (111) plane+TaC (200) plane}] in the TaC (111) plane is 60% or less, the effective work function of the gate electrode 110 of the n-channel MIS transistor 100 is smaller than the effective work function when uncrystallized Ta—C alloy is used. For this reason, the difference between the effective work function of the gate electrode 110 of the n-channel MIS transistor 100 and the effective work function of the gate electrode 210 of the p-channel transistor 200 can be obtained more easily.

Furthermore, the lower layer gate electrode 211 of the gate electrode 210 of the p-channel MIS transistor 200 may be composed of Ta—C alloy including impurity atoms. Putting impurity atoms whose electronegativity is smaller than that of Ta in the part of the lower layer gate electrode 211 makes it easier to set the average electronegativity difference between the lower layer gate electrode 211 and upper layer gate electrode 212 to 0.1 or more. Therefore, it is desirable that Sc, Y, La, Zr, or Hf should be used as impurity atoms. Moreover, those classified into lanthanoid (Ce, Pr, Nd, Pm, Sm, Eu, Gd, Tb, Dy, Ho, Er, Tm, Yb, Lu), actinoid (Th, Pa, U, Np, Pu, Am, Cm, Bk, Cf, Es, Fm, Md, No, Lr) or alkaline earth metal (Mg, Ca, Sr, Ba, Ra) may be used as impurity atoms.

A manufacturing method of the second embodiment is basically the same as that of the first embodiment, except that the gate of the n-channel MIS transistor 110 has to be of a single layer and the gate of the p-channel MIS transistor 200 has to be of a stacked layer. This type of device can be manufactured by changing, for example, the process of FIG. 10A in the manufacturing method of the first embodiment to the process of selectively depositing a Ta layer only on the gate insulating film 204 of the p-channel MIS transistor 200.

Furthermore, as explained above, in the second embodiment, when the gate electrode 110 of the n-channel MIS transistor 100 and the upper layer gate electrode 212 of the p-channel MIS transistor 200 are formed, it is desirable to form an nMIS $TaC_x$ electrode where the (111) plane crystalline orientation rate is 60% or less.

Figure 14A:
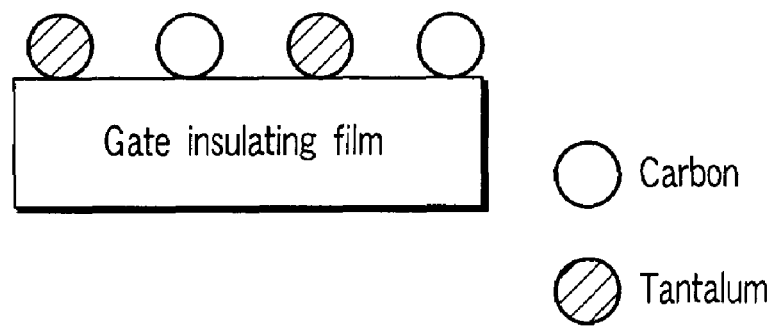
FIGS. 14A to 14C are pattern diagrams to help explain a method of forming an nMIS $TaC_x$ electrode.
Figure 14B:
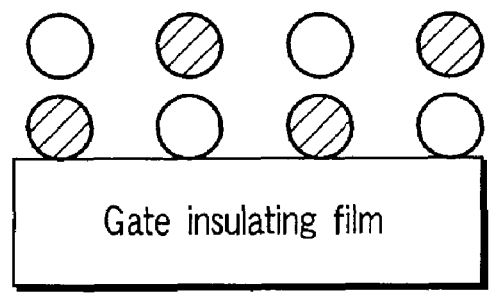
Figure 14C:
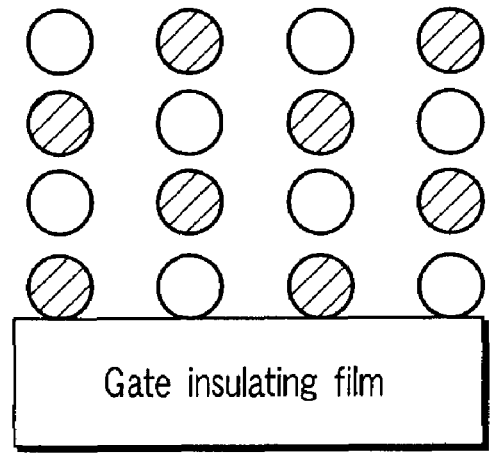

To form an nMIS $TaC_x$ electrode where the (111) plane crystalline orientation rate is 60% or less, it is important to form a film so as to prevent Ta and C from existing alternately in the film thickness direction unlike the formation of the pMIS $TaC_x$ electrode explained in the first embodiment. FIGS. 14A to 14C schematically show the film forming principle.

To form an nMIS $TaC_x$ electrode by CVD techniques, it is important to supply a Ta source and a C source at the same time. This causes a TaC film to be formed, while Ta and C coexist in a single layer, which makes a (111) plane less liable to be formed and instead a (200) plane more liable to be formed. Here, the Ta source and C source may be the same as those used in forming the pMIS $TaC_x$ electrode.

When sputtering techniques are used, it is desirable to use simultaneous sputtering of the Ta target and C target. In this case, unlike the pMIS $TaC_x$ electrode forming method, sputtering Ta and C at the same time makes the (111) plane less liable to be formed and the (200) plane more liable to be formed. In the second embodiment, a $TaC_x$ film with C/Ta=1.0 was deposited to a thickness of 100 nm by the simultaneous sputtering of the Ta target and C targets, or two targets. The deposition of the film may be carried out CVD techniques or MBE techniques.

Unlike in the first embodiment, in the second embodiment, the gate electrode 210 of the p-channel MIS transistor 200 is caused to have a stacked structure of the lower layer gate electrode 211 and upper layer gate electrode 212, the average electronegativity of the upper layer gate electrode 212 is made 0.1 or more greater than the average electronegativity of the lower layer gate electrode 211, and the metal material of the gate electrode 110 of the n-channel MIS transistor 100 is made the same as that of the upper layer gate electrode 212 of the p-channel MIS transistor 200. This makes it possible to make the effective work function of the gate electrode 210 of the p-channel MIS transistor 200 0.4 eV or more higher than the effective work function of the gate electrode 110 of the n-channel MIS transistor 100.

In this case, since the upper layer gate 212 of the p-channel MIS transistor 200 and the gate electrode 110 of the n-channel MIS transistor 100 have both the same composition of TaC and the lower layer gate electrode 211 of the p-channel MIS transistor 200 is very thin, the etching processes of the gates can be carried out collectively. Furthermore, although the lower layer electrode 211 of the p-channel MIS transistor 200 is made of TaC and differs in composition from the upper layer gate electrode 212 of the p-channel MIS transistor 200 and the gate electrode 110 of the n-channel MIS transistor 100, they are the same in constituent elements. Therefore, when electrodes are formed, another material is not needed. Accordingly, the same effect as that of the first embodiment is obtained.

Third Embodiment

FIG. 15 is a sectional view showing a schematic structure of a semiconductor device with a dual-metal-gate CMIS structure.

A first gate insulating film 104 is formed at the surface of a p-type semiconductor region 101. On the gate insulating film 104, a first gate electrode 110 having a stacked structure is formed. A lower layer (a first lower layer gate electrode) 111 of the gate electrode 110 is composed of Ta—C alloy whose thickness is 1 monolayer or more and 3 nm or less. An upper layer (a first upper layer gate electrode) 112 of the gate electrode is composed of Ta—C alloy. The average electronegativity $\chi$ of the lower layer gate electrode 111 is greater than the average electronegativity $\chi$ of the upper layer gate electrode 112. This is equivalent to the C atom concentration of the lower layer gate electrode 111 being higher than the C atom concentration of the upper layer gate electrode 112.

A second gate insulating film 204 is formed at the surface of an n-type semiconductor region 201. On the surface of the gate insulating film 204, a second gate electrode 210 having a stacked structure is formed. A lower layer (a second lower layer gate electrode) 211 of the gate electrode 210 is composed of Ta—C alloy whose thickness is 1 monolayer or more and 3 nm or less. An upper layer (a second upper layer gate electrode) 212 of the gate electrode is composed of Ta—C alloy. The average electronegativity $\chi$ of the lower layer gate electrode 211 is smaller than the average electronegativity $\chi$ of the upper layer gate electrode 212. This is equivalent to the C atom concentration of the lower layer gate electrode 211 being lower than the C atom concentration of the upper layer gate electrode 212. The material of the upper layer gate electrode 212 on the pMIS side is the same as that of the upper gate electrode 112 on the nMIS side. The upper layer gate electrode 212 is formed at the same time the upper layer gate electrode 112 is formed.

The sum of the absolute value of the difference in average $\chi$ between the lower layer gate electrode 211 and the upper layer gate electrode 212 and the absolute value of the difference in average $\chi$ between the lower layer gate electrode 111 and the upper layer gate electrode 112 is 0.1 or more. This is equivalent to the atom density of C at the lower gate electrode 111 being 10 at. % higher than the atom density of C at the lower gate electrode 211.

On the upper layer gate electrodes 112, 212, high melting point metal, such as W or TiN, may be further formed. In FIG. 15, the remaining configuration, including element isolating regions 11, source/drain regions 102, 202, extension regions 103, 203, and gate sidewall insulating films 120, 220, can be formed by conventional semiconductor processes.

The third embodiment is a combination of the n-channel MIS transistor 100 of the first embodiment and the p-channel MIS transistor 200 of the second embodiment. Although the third embodiment is at a disadvantage in that the number of manufacturing processes increases as compared with the first and second embodiments, it has the advantage of being capable of determining the effective work function difference between the gate electrode of the n-channel MIS transistor 100 and that of the p-channel MIS transistor 200 more easily. That is, since the gate electrode of the n-channel MIS transistor 100 and that of the p-channel MIS transistor 200 both have a stacked structure, the $\chi$ difference between the upper layer and lower layer of each gate electrode is allowed to be smaller than the $\chi$ difference between the upper layer and lower layer of the gate electrode in each of the first and second embodiments.

In the third embodiment, to satisfy the expressions $\Phi_{eff}(P) \geq 4.7$ eV and $\Phi_{eff}(N) \leq 4.3$ eV, it follows from equation (3) that the absolute value $\Delta\chi(1)$ of the electronegativity difference between the lower layer gate electrode 111 and upper layer gate electrode 112 and the absolute value $\Delta\chi(2)$ of the electronegativity difference between the lower layer gate electrode 211 and upper layer gate electrode 212 have to satisfy the following expressions:

$$\Phi_{eff}(1) - 0.4 \times \Delta\chi(1)/0.1 \leq 4.3$$

$$\Phi_{eff}(2) + 0.4 \times \Delta\chi(2)/0.1 \geq 4.7$$

Here, $\Phi_{eff}(1)$ and $\Phi_{eff}(2)$ are the $\Phi_{eff}$ of a gate electrode composed of the same metal material single layer as that of each of the upper layer gate electrode 112 and upper layer gate electrode 212.

The structure of the third embodiment can be manufactured by combining the manufacturing processes of the first embodiment and the manufacturing processes of the second embodiment.

(Modification)

This invention is not limited to the above-described embodiments. While in the embodiments, TaC has been used as the gate electrodes, TiC, TaN, or TiN may be used in place of TaC. The thickness of the lower layer gate electrode may be changed suitably, provided that it is in the range of 1 monolayer or more and 3 nm or less. Similarly, the average electronegativity difference between the lower layer gate electrode and upper layer electrode and further the relationship between the atom density of C at the lower gate electrode and the atom density of C at the upper gate electrode may be changed suitably in the scope explained in the embodiments. Furthermore, the gate insulating film is not limited to a silicon oxide film and may be a silicon nitride film, or a silicon oxidized nitride film, or further another high-k dielectric film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device with MIS transistors, comprising:
    an n-channel MIS transistor which is fabricated on a substrate and which includes a p-type semiconductor region formed on the substrate, a first gate insulating film formed on the p-type semiconductor region, a first lower layer gate electrode which is formed on the first gate insulating film and whose film thickness is one monolayer or more and 3 nm or less, and a first upper layer gate electrode which is formed on the first lower layer gate electrode, which is made of metal material, and whose average electronegativity is 0.1 or more smaller than the average electronegativity of the first lower layer gate electrode; and
    a p-channel MIS transistor which is fabricated on the substrate and which includes an n-type semiconductor region formed on the substrate, a second gate insulating film formed on the n-type semiconductor region, and a second gate electrode which is formed on the second gate insulating film and is made of the metal material.

2. The semiconductor device according to claim 1, wherein the second gate electrode has an effective work function $\Phi_{eff}(2)$ of 4.7 eV or more and absolute value of an average electronegativity difference $\Delta\chi(1)$ between the first lower layer gate electrode and the first upper layer gate electrode fulfills a following expression:

$$\Phi_{eff}(2)-0.4\times\Delta\chi(1)/0.1 \leq 4.3.$$

3. The semiconductor device according to claim 1, wherein the metal material is Ta—C alloy.

4. The semiconductor device according to claim 3, wherein the first lower layer gate electrode is made of Ta—C alloy and a C atom density of the first lower layer gate electrode is 10 at. % or more higher than the C atom density of the first upper layer gate electrode.

5. The semiconductor device according to claim 3, wherein the first lower layer gate electrode is made of metal material obtained by adding at least one of N, O, F, P, S, Cl, As, Se, Br, and I to Ta—C alloy.

6. The semiconductor device according to claim 3, wherein the second gate electrode has to have a crystalline orientation rate [TaC (111) plane/{TaC (111) plane+TaC (200) plane}] of 80% or more in the film thickness direction of the second gate electrode.

7. A semiconductor device with MIS transistors, comprising:
an n-channel MIS transistor which is fabricated on a substrate and which includes a p-type semiconductor region formed on the substrate, a first gate insulating film formed on the p-type semiconductor region, and a first gate electrode which is formed on the first gate insulating film and is made of metal material; and
a p-channel MIS transistor which is fabricated on the substrate and which includes an n-type semiconductor region formed on the substrate, a second gate insulating film formed on the n-type semiconductor region, a second lower layer gate electrode which is formed on the second gate insulating film and whose film thickness is one monolayer or more and 3 nm or less, and a second upper layer gate electrode which is formed on the second lower layer gate electrode, which is made of metal material, and whose average electronegativity is 0.1 or more greater than the average electronegativity of the second lower layer gate electrode.

8. The semiconductor device according to claim 7, wherein the first gate electrode has an effective work function $\Phi_{eff}(1)$ of 4.3 eV or less and absolute value of an average electronegativity difference $\Delta\chi(2)$ between the second lower layer gate electrode and the second upper layer gate electrode fulfills a following expression:

$$\Phi_{eff}(1)+0.4\times\Delta\chi(2)/0.1 \geq 4.7.$$

9. The semiconductor device according to claim 7, wherein the metal material is made of Ta—C alloy.

10. The semiconductor device according to claim 9, wherein the second lower layer gate electrode is made of Ta—C alloy and the C atom density of the second lower layer gate electrode is 10 at. % or more lower than the C atom density of the second upper layer gate electrode.

11. The semiconductor device according to claim 9, wherein the second lower layer gate electrode is made of metal material obtained by adding at least one of Sc, Y, La, Zr, and Hf to Ta—C alloy.

12. The semiconductor device according to claim 10, wherein the first gate electrode has to have a crystalline orientation rate [TaC (111) plane/{TaC (111) plane+TaC (200) plane}] of 60% or less in the film thickness direction of the first gate electrode.

13. A semiconductor device comprising:
a substrate;
an n-channel MIS transistor which includes a p-type semiconductor region formed on the substrate, a first gate insulating film formed on the p-type semiconductor region, a first lower layer gate electrode which is formed on the first gate insulating film and whose film thickness is one monolayer or more and 3 nm or less, and a first upper layer gate electrode which is formed on the first lower layer gate electrode, which is made of metal material, and whose average electronegativity is smaller than an average electronegativity of the first lower layer gate electrode; and
a p-channel MIS transistor which includes an n-type semiconductor region formed on the substrate, a second gate insulating film formed on the n-type semiconductor region, a second lower layer gate electrode which is formed on the second gate insulating film and whose film thickness is one monolayer or more and 3 nm or less, and a second upper layer gate electrode which is formed on the second lower layer gate electrode, which is made of the metal material, and whose average electronegativity is greater than an average electronegativity of the second lower layer gate electrode,
wherein a sum of an absolute value $\Delta\chi(1)$ of an average electronegativity difference between the first lower layer gate electrode and the first upper layer gate electrode and an absolute value $\Delta\chi(2)$ of an average electronegativity difference between the second lower layer gate electrode and the second upper layer gate electrode is 0.1 or more.

14. The semiconductor device according to claim 13, wherein an effective work function $\Phi_{eff}(1)$ of a first single layer gate electrode when the first single layer gate electrode is made of the same metal material as that of the first upper layer gate electrode, an effective work function $\Phi_{eff}(2)$ of a second single layer gate electrode when the second single layer gate electrode is made of the same metal material as that of the second upper layer gate electrode, the $\Delta\chi(1)$, and the $\Delta\chi(2)$ satisfy following expressions:

$$\Phi_{eff}(1)-0.4\times\Delta\chi(1)/0.1 \leq 4.3$$

$$\Phi_{eff}(2)+0.4\times\Delta\chi(2)/0.1 \geq 4.7.$$

15. The semiconductor device according to claim 13, wherein the first upper layer gate electrode and the second upper layer gate electrode are made of Ta—C alloy of identical composition.

16. The semiconductor device according to claim 13, wherein the first lower layer gate electrode and the second lower layer gate electrode are made of Ta—C alloy and a C atom density of the first lower layer gate electrode is higher than a C atom density of the first upper layer gate electrode, the C atom density of the second lower layer gate electrode is lower than the C atom density of the first upper layer gate electrode, and the C atom density of the first lower layer gate electrode is 10 at. % or more higher than the C atom density of the second lower layer gate electrode.

17. The semiconductor device according to claim 16, wherein the first lower layer gate electrode is made of metal material obtained by adding at least one of N, O, F, P, S, Cl, As, Se, Br, and I to Ta—C alloy.

18. The semiconductor device according to claim 16, wherein the second lower layer gate electrode is made of metal material obtained by adding at least one of Sc, Y, La, ZR, and Hf to Ta—C alloy.

* * * * *